United States Patent [19]
Stone

[11] Patent Number: 5,530,288
[45] Date of Patent: Jun. 25, 1996

[54] PASSIVE INTERPOSER INCLUDING AT LEAST ONE PASSIVE ELECTRONIC COMPONENT

[75] Inventor: David B. Stone, Owego, N.Y.

[73] Assignee: International Business Machines Corporation, Armonk, N.Y.

[21] Appl. No.: 321,677

[22] Filed: Oct. 12, 1994

[51] Int. Cl.⁶ .......................... H01L 23/053; H01L 23/02
[52] U.S. Cl. .......................... 257/700; 257/686; 257/738; 257/774; 257/780; 257/924
[58] Field of Search ........................ 257/678, 685, 257/686, 700, 737, 738, 774, 777, 778, 780, 904, 924

[56] References Cited

U.S. PATENT DOCUMENTS

| | | |
|---|---|---|
| 4,349,862 | 9/1982 | Bajorek et al. . |
| 4,744,008 | 5/1988 | Black et al. . |
| 4,803,595 | 2/1989 | Kraus et al. . |
| 4,811,082 | 3/1989 | Jacobs et al. . |
| 5,101,323 | 3/1992 | Prevost . |
| 5,177,594 | 1/1993 | Chance et al. . |
| 5,258,648 | 11/1993 | Lin . |
| 5,272,600 | 12/1993 | Carey . |
| 5,404,044 | 4/1995 | Booth et al. ............................ 257/700 |

*Primary Examiner*—Sara W. Crane
*Assistant Examiner*—Carl Whitehead, Jr.
*Attorney, Agent, or Firm*—Pollock, Vande Sande & Priddy

[57] ABSTRACT

An interposer including a first face and second face opposite the first face and at least one electrically conductive plane. The at least one electrically conductive plane functions as a power, ground, or signal plane. At least one electrically insulating plane is positioned on opposite sides of the at least one electrically conductive plane. A plurality of plated through holes are formed through the at least one electrically conductive planes and the at least two electrically insulating planes. The through holes are selectively electrically joined to the at least one electrically conductive plane. At least one passive electronic structure is positioned within the interposer structure.

9 Claims, 2 Drawing Sheets

PASSIVE INTERPOSER INCLUDING AT LEAST ONE PASSIVE ELECTRONIC COMPONENT

FIELD OF THE INVENTION

The invention relates to interposers including at least one passive electronic component within the structure of the interposer and method of forming such interposers. The invention also relates to electronic packages including at least one interposer including at least one passive electronic component within the structure of the interposer and at least one electronic component attached to both sides of the interposer and method of forming such electronic packages.

BACKGROUND OF THE INVENTION

Often, it is desired to make changes to the flow of current to and from electronic devices. For instance, it is required to make engineering or wiring changes between interconnected electronic devices. Such changes can, for example, include altering the wiring path between an integrated circuit chip and a circuit board or card to which it is attached.

Devices known as interposers act as intermediate structures between, for instance, an integrated circuit chip mounted on a chip carrier and a circuit board. An interposer typically includes at least one conductive plane sandwiched between two dielectric planes. The conductive plane typically includes a pattern of circuitry. A plurality of plated through holes are formed through the planes of the interposer so that the pattern of plated through holes formed on one surface of the interposer matches the pattern of ground, power and signal sites on the chip carrier; and the pattern of plated through holes on-the opposite side of the interposer matches the pattern of ground, power, and signal sites on the circuit board or card.

The circuitry in the conductive plane of the interposer provides connections between the chip carrier and the circuit board. Therefore, the interposer can provide connections between circuit boards and chips having different patterns of ground, power, and signal sites without requiring significant alteration of the circuit board or chip or chip carrier. This can save money by not requiring a separate circuit board for each type of chip and could allow a chip and or carrier to be removed from one circuit board and attached to another with relative ease. An interposer can also alter the function of a chip without requiring redesign of the chip or chip carrier.

It may also become necessary to modify the internal circuitry of a chip or card to correct defective lines or vias or to make changes in the basic circuitry to accommodate design changes to upgrade an electronic package or to modify a package use with different devices, for example. An interposer can correct such defects and make such changes. Furthermore, an interposer may also eliminate problems associated with chips mounted on circuit boards having a different coefficient of thermal expansion.

In another effort to make changes in the function of an electronic package, attempts have been made to incorporate electronic circuit components within the structure of a circuit board. Such components could act similarly to an interposer.

SUMMARY OF THE INVENTION

In attempts to incorporate components in a circuit board, the inventor of the present invention desired to bury or imbed resistors in circuit boards. However, the material from which such resistors are formed was not compatible with the circuit board material. Materials used to make circuit boards may include fluorocarbons. Commonly used fluorocarbons include polytetrafluoroethylenes (PTFE's), in particular, TEFLON, and composites containing PTFE's.

A specific problem encountered in trying to incorporate passive electronic components is that the material typically used to form the passive electronic components was not compatible with the physical requirements of the processes used to joining circuit boards made of typically used dielectrics, such as fluorocarbons. The problem was particularly evident when trying to form resistors in circuit boards formed from composites containing PTFE's. The resistor material was particularly unsuitable to the pressures used in laminating layers of the circuit boards. The planes of PTFE based circuit boards and cards typically are laminated together using high temperatures and pressures. A variety of alternatives were employed to overcome the shortcomings of typical materials and processes.

The inventor also encountered space limitation problems when trying to locate components on a circuit board. By locating such components within an interposer structure, the present invention also avoids the limited area on circuit boards for locating such components.

Recognizing problems in the prior art of the incompatibility of building passive electronic components, such as resistors and capacitors, among others, the inventor of the present invention sought to provide the function of such components in another manner. It was discovered that the present invention overcomes the problems in known processes and materials and that the function of resistors buried in circuit boards could be performed by an interposer structure.

Therefore, it is an object of the present invention to furnish an interposer that provides the function of passive electronic components in circuit boards or cards.

Another object of the present invention is to overcome the incompatibility of passive electronic components, such as resistors, capacitors, conductors, inductors, among others, with circuit board or card material, in particular PTFE-based circuit board or card material.

A further object of the present invention is to provide a device including passive electronic components that functions as an interposer between a surface mountable package and a circuit board or card.

An additional object of the present invention is to provide an interposer that is surface mount attachable to accept surface mount components.

In view of the above objectives and others, according to preferred aspects, the present invention include an interposer including a first face and a second face opposite the first face. The interposer also includes at least one electrically conductive plane. The at least one electrically conductive plane functions as a power, ground, or signal plane. At least two electrically insulating planes are included, one positioned on each side of the at least one electrically conductive plane. A plurality of plated through holes are formed through the at least one electrically conductive plane and the at least two electrically insulating planes. The through holes are selectively connected to the at least one electrically conductive plane. At least one passive electronic structure is positioned within the interposer and is electronically connected to the plated through hole and/or the at least one electrically conductive plane.

According to other preferred aspects, the present invention provides an electronic package including an interposer.

The interposer includes a first face and a second face opposite the first face. The interposer also includes at least one electrically conductive plane. The at least one electrically conductive plane functions as a power, ground, signal or mounting plane. At least two electrically insulating planes are included, one positioned on each side of the at least one electrically conductive plane.

A plurality of plated through holes are formed through the at least one electrically conductive plane and the at least two electrically insulating planes. The through holes are selectively joined to the at least one electrically conductive plane. At least one passive electronic structure is positioned within the interposer and is electrically connected to at least one plated through hole and/or the at least one electrically conductive plane.

At least one first component is mounted to the first face of the interposer. The at least one first component includes a plurality of ground, power, signal and/or mounting sites electrically connected to the plated through holes of the interposer. At least one second component mounted to the second face of the interposer. The at least one second component includes a plurality of ground, power, signal and/or mounting sites electrically connected to the plated through holes of the interposer. The interposer provides selective connections between the ground, power, signal and/or mounting sites of the at least one first component and the at least one second component.

According to further preferred aspects, the present invention also includes a method of forming an interposer including at least one passive electronic component. The method includes the step of forming a core comprised of a first electrically conductive plane and a second electrically conductive plane. The first and second electrically conductive planes function as a ground, signal, and/or power planes. The first and second electrically conductive planes are separated by a first plane of an electrically insulating material. At least one passive electronic component is provided in or on one of the electrically conductive planes A second electrically insulating plane is formed by depositing a layer of an electrically insulating material on an exposed surface of one of the first or second electrically conductive planes. A third electrically insulating plane is formed by depositing a layer of an electrically insulating material on an exposed surface of the other of the first and second electrically conductive planes. A plurality of through holes is formed through the electrically insulating planes, the electrically conductive planes, and the at least one passive electronic component. A mounting plane is formed by depositing a layer of an electrically conducting material on the second and third electrically insulating planes and selectively etching the electrically conducting material. Electrically conductive material is plated on a surface of the through holes, so as to selectively electrically connect the plated through holes with the passive electronic component, the electrically conducting planes, the electrically insulating planes, and/or the mounting planes.

According to additional preferred aspects, the present invention also includes a method of forming an electronic package. The method includes the step of providing an interposer including at least one passive electronic component formed therein. At least one electronic component is then electrically connected to each side of the interposer.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications and various obvious respects without departing from the invention. Accordingly, the drawings and description are to regarded as illustrative in nature and not as restrictive.

DETAILED DESCRIPTION OF VARIOUS AND PREFERRED EMBODIMENTS

Figure 1:
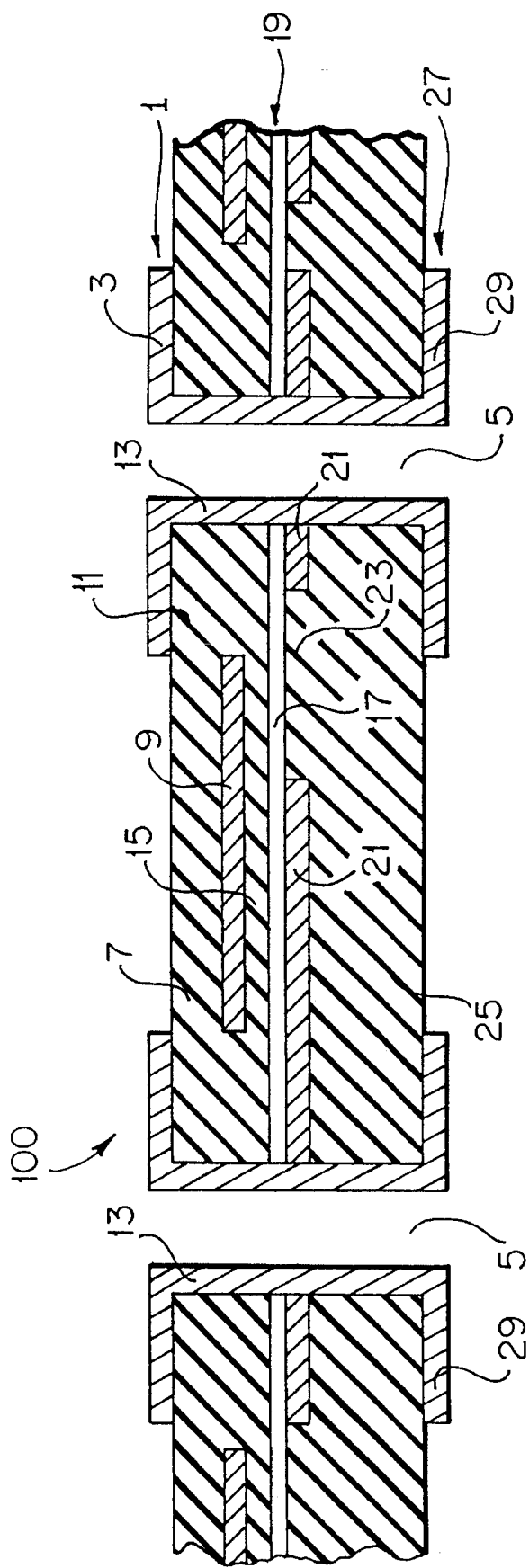
FIG. 1 represents cross-sectional view of one embodiment of an interposer structure, according to the present invention, including a resistor as a passive electronic component.

With the present invention, it has been discovered that passive electronic components can be located within an interposer structure. The interposer includes within its structure at least one passive electronic component such as, but not limited to, a resistor, capacitor, or conductor. By mounting at least one electronic device, such as a circuit board, circuit card, chip, chip carrier, another interposer, among others, on each side of the interposer, the present invention can provide the function of the passive electronic component in the overall circuit, which includes the interposer, the electronic devices and any other electrically device that the interposer and the attached devices are electrically connected to.

As stated above, the present invention was developed while trying to provide passive electronic components in a circuit board. The present invention avoids incompatibility problems between the materials used to make circuit boards and passive electronic components, but also eliminates space problems inherent in trying to add an additional structure to a circuit board. Circuit boards are of limited size and most of the area on the power, ground, signal and mounting planes is taken up by other necessary structures.

An interposer may also be used in any situation in which it is difficult or impossible to provide passive electronic components in or on a chip, circuit board or card, or any other component. For instance, problems have been encountered in providing resistors in chips made of gallium arsenide. An interposer according to the present invention could be used to provide a resistor, any other passive electronic component, whether described here or not, when joined to such a chip.

An interposer according to the present invention may include at least one electrically conductive plane, such as a power, ground, signal and/or mounting plane. The passive electronic component(s) may be included within the structure of the interposer or on an exposed surface of the interposer. Also, an interposer according to the invention includes at least one passive electronic component electrically connected to at least one of the electrically conductive planes and/or plated through holes formed in the interposer.

To electrically isolate the at least one electrically conductive plane and the at least one passive electronic component, the interposer may include at least two planes of an electrically insulating substance. The electrically insulating substance may also be included in the interposer on the exposed surfaces of the at least one electrically conductive plane and the at least one passive electronic component.

Through holes may be included in the interposer. The surface of the through holes may be plated with an electrically conductive substance. The electrically conductive substance may extend adjacent the through holes over the surface of the electrically insulating substance located over the at least one electrically conductive plane and the at least one passive electronic component to provide a mounting surface for attached components. Alternatively, the mounting surface may be provided by a separate mounting plane. The material plated on to the through holes may be electrically connected to the at least one electrically conductive plane and the at least one passive electronic component. The at least one electrically conductive plane and the at least one passive electronic component may be located in any manner relative to each other.

FIG. 1 shows one embodiment of an interposer 100 according to the present invention. The embodiment shown in FIG. 1 includes a multi-layer interposer structure including two electrically conductive planes, a plurality of dielectric planes, a resistor plane, and two mounting planes. However, as stated above, the present invention may include any number of electrically conductive planes and passive electronic components.

In the embodiment shown in FIG. 1, the uppermost plane of the embodiment of the interposer 100 shown is a mounting plane. The mounting plane preferably is in the form of material 3 extending around the plated through holes 5. The material forming the mounting plane may be the same as that on the inside surface of the plated through holes. An example of such a material is copper. Alternatively, the plating material may also be formed of another material. In either case, the mounting plane 1 preferably is electrically connected to the material on the plated through holes. Among the materials which may be used to form the mounting plane are any commonly known materials used in coating plated through holes, such as, among others, copper and copper coated with, among other substances, tin, tin/lead, and/or gold. The mounting plane may provide points of attachment for electronic devices attached to the interposer 100, as discussed below.

Underneath the mounting plane and joined thereto preferably sits a plane 7 of a electrically insulating material. The electrically insulating material may be formed from any commonly known dielectric. Examples of such materials include FR4, 212, polyimide, cyanate ester, PTFE, filled PTFE materials, 8212 made by the IBM corporation, and zinc oxide filled materials, among others. In the interposer 100, the proximity of electrically conducting planes may generate some capacitance. Therefore, the dielectric material used preferably has a high dielectric constant. One way the dielectric constant may be improved is to introduce a substance into the dielectric to increase the dielectric constant. For example, barium titanate may be introduced into the dielectric by doping. Other materials may also be used to enhance the dielectric's performance using doping or other methods to introduce the material. The electrically insulating plane preferably electrically isolates the mounting plane and the other conductive plane(s) and passive electronic component(s) located elsewhere in the interposer 100 structure. Additionally, the electrically insulating plane preferably also electrically isolates any electrically conductive portions of the interposer 100 from electrical devices attached to the interposer and from anything else that the interposer could potentially contact.

In the embodiment shown in FIG. 1, a voltage plane 9 directly abuts at least a portion of the electrically insulating plane 7. The voltage plane may be formed from any commonly known electrical conducting materials. For example, copper or copper/INVAR/copper (CIC), among other materials, may be used to form the voltage plane. Although the embodiment shown in FIG. 1 includes a voltage plane abutting the electrically insulating plane, other electrically conductive planes may abut the electrically insulating plane. For instance, the voltage plane 9 could be a ground or signal plane. Alternatively, a passive electronic component may be included in the interposer 100, abutting an electrically insulating plane.

Although the voltage plane in the embodiment shown in FIG. 1 does not contact the plating material 13 on the plated through holes 5, elsewhere in the embodiment shown in FIG. 1, the voltage plane 9 may be electrically connected to selected plated through holes 5. Since in the cross-section shown in FIG. 1 the voltage plane 9 does not contact the plated through hole material 13, the portions of the electrically insulating plane 7 not abutted by the voltage plane 9 in the embodiment shown in FIG. 1 preferably abut against additional electrically insulating material 11. However, unlike the cross section shown in FIG. 1, in areas where the voltage plane 9 contacts the plated through hole material 13, the voltage plane 9, rather than any additional electrically insulating material, will contact the electrically insulating plane 7 even near the plated through hole 5.

Travelling downwardly through the embodiment shown in FIG. 1, the next plane encountered after the voltage plane is another plane 15 of an electrically insulating material. The plane of electrically insulating material 15 electrically isolates the voltage plane from the plane which includes a passive electronic component 17. As shown in FIG. 1, the plane of electrically insulating material 15 may also abut or be continuous with the portions of the electrically insulating plane 11 which complete the structure in areas where the voltage plane 9 or other electrically conductive plane does not extend. The electrically insulating plane 15, as well as any of the other electrically insulating planes, may be formed from one of the electrically insulating materials listed above.

Directly abutting the electrically insulating plane may be a plane 19 that includes at least one passive electronic component 17. The embodiment shown in FIG. 1 includes a planar resistor. The resistor structure may be formed from a plurality of materials. For instance, the material known as Ohmegaply may be used to form the planar resistor layer.

The resistor 17 included in the embodiment shown in FIG. 1 may encompass the entire plane 19 that it is formed in. In other embodiments, the passive electronic components may be formed in discreet areas in one or more planes in the interposer 100 structure.

The resistor structure may be of known designs. For instance, the resistors may be an annular resistor design. Other designs may also be used for the resistors, capacitors, conductors, inductors, or any other passive electronic components included in the interposer structure of the present invention. Regardless of the design of the passive electronic component that is used, it is important that the passive component(s) is included in the interposer rather than in the circuit board or other structure or even not included at all. As stated above, many problems existed in locating or trying to locate passive electronic components in a circuit board. The present invention overcomes these problems, among others.

The plane including the passive electronic component may directly abut and be joined to another plane of an electrically conductive material 21. Alternatively, the passive electronic component 21 may be physically isolated but electrically connected to a plane of an electrically conductive material 21. As shown in FIG. 1, the electrically conductive plane 21 may not abut the entire resistor 17. Portions of the resistor 17 not abutting the electrically conductive plane 21 may abut against an electronically insulating material 23. The electrically insulating material 23 may fill in all portions of the plane not occupied by the electrically conductive material.

In the embodiment shown in FIG. 1, the electrically conductive plane 21 is electrically connected to the material 13 plated on the surface of the plated through holes 5. In accordance with known practices, the electrically conductive plane 21 may not be electrically connected to all of the other plated through holes. At least some of the other through holes may be electrically connected to other electrically conductive planes, such as voltage plane 9, in the embodiment shown in FIG. 1.

The electrically conductive plane 21 may be formed from any of the materials used to form the electrically conductive plane 9 or any other suitable material. Similarly, the electrically insulating 23 material may be formed of a similar material to the materials that may be used to form the other electrically insulating portions 7, 11, and 15 discussed above. Any other suitable material may also be used to form the electrically insulating portion 23.

Opposite the planar resistor 17, the electrically conductive plane 21 and the associated electrically insulating material 23 may be connected to an other electrically insulating plane 25. The electrically insulating plane 25 may serve a similar purpose to the electrically insulating plane 7 located at the top of the interposer 100. The electrically insulating plane 25 may be laid down at the same time as the electrically insulating material 23. The electrically insulating plane 25 may be formed from any of the materials for forming electrically insulating layers discussed above or any other suitable material.

Another mounting plane 27 similar to the mounting plane 1 may be formed over portions of the electrically insulating plane 25. The mounting plane 27 may be formed from electrically conducting material 29 extending around the plated through holes 5. The material 29 forming the mounting plane 27 may be similar to the material 13 on the inside surface of the plated through holes 5. Alternatively, the plating material 29 may also be formed of another material. In either case, the mounting plane 29 preferably is electrically connected to the material 13 on the plated through holes 5. Among the materials which may be used to form the mounting plane 27 are any commonly known materials used in coating plated through holes, such as, among others, copper and copper coated with, among other materials, tin, gold, or tin/lead. Also similar to the mounting plane 1, the mounting plane 27 may provide points of attachment for electronic devices attached to the interposer 100, as discussed below.

The arrangement of the through holes and the electrically conductive planes in the embodiment of the interposer 100 shown in FIG. 1 does not redistribute the wiring of devices attached to the sides of the interposer 100. In other embodiments, the plating material 13 on the through holes may not extend entirely down the through holes and may only be connected to certain of the electrically conducting planes and/or the passive electronic component(s) in a manner such that the a ground, power, or signal site on a device joined to a plated through hole may not be electrically connected to a corresponding ground, power, or signal site on a device attached to the opposite side of the plated through hole. The electrical connections between the plated through hole and the conductive planes and passive electronic components may also be varied to vary the flow path of signals passing through the interposer between components mounted on opposite sides of the interposer.

The structure of an interposer according to the present invention, including the number of each type of plane or other structure discussed above, the form of the structure, the arrangement of the planes, and the materials used to form the planes and other parts of the interposer, among other things, may be varied. For instance, the interposer may include only one electrically conductive plane with one electrically connected passive electronic component. Alternatively, more than one passive electronic component may be included in the interposer. The embodiment shown in FIG. 1 is meant only to be illustrative of an interposer of the invention. Those skilled in the art could vary the above structure without undue experimentation to arrive at alternative structures for use with particular applications.

Figure 2:
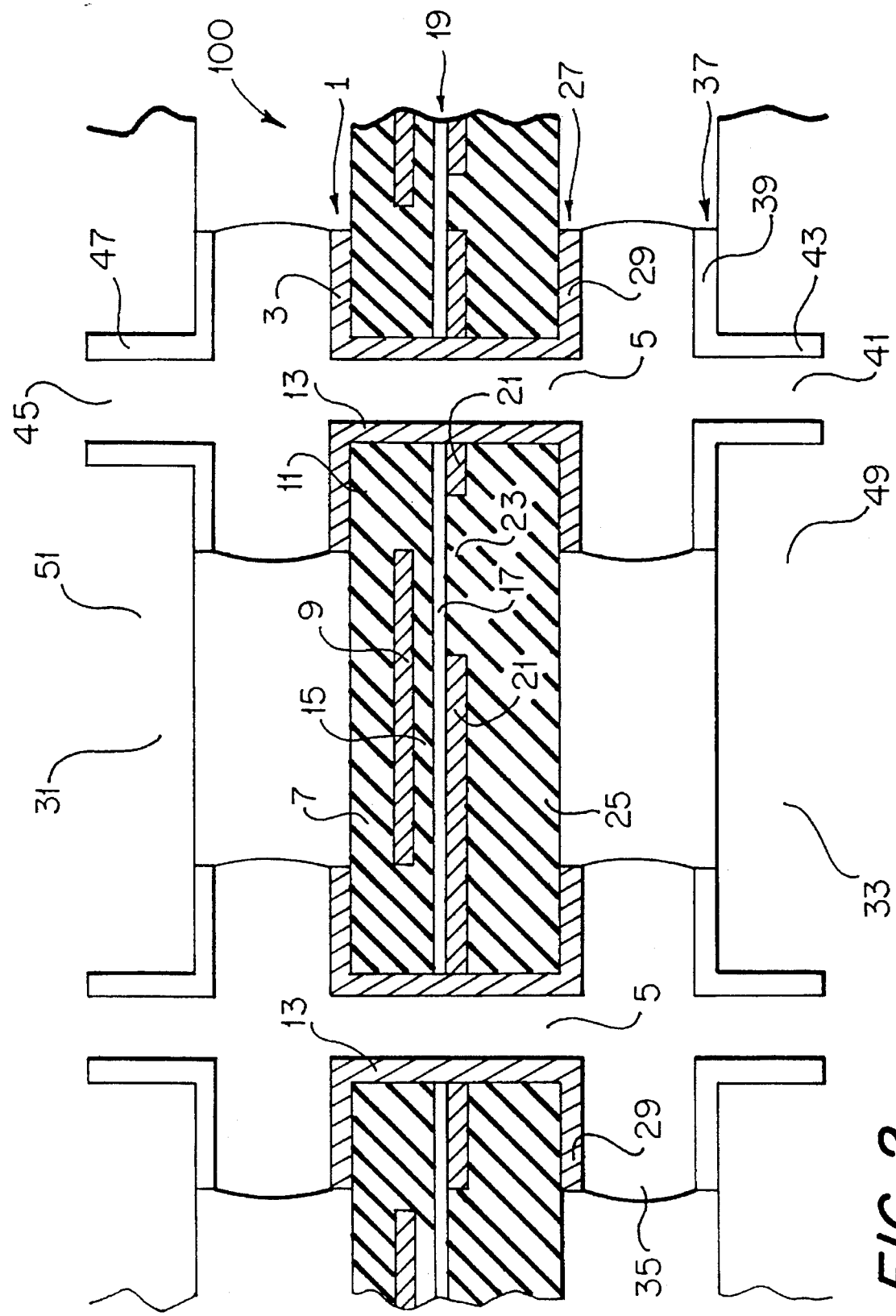
FIG. 2 represents a cross-sectional view of an embodiment of an electronic package according to the present invention including the embodiment of an interposer shown in FIG. 1.

According to the present invention, one or more electronic devices, such as circuit boards, circuit cards, chips, chip carriers, and other interposers, among others, may be attached to an interposer of the present invention thereby forming an electronic package. Preferably, the device(s) are electronically connected to the interposer 100. However, in addition, the device(s) may also be attached for physical support. FIG. 2 shows the embodiment of an interposer 100 shown in FIG. 1 with an electronic device 31 and 33 joined on both sides of the interposer 100. More than one device may be attached to each side of the interposer and any combination of devices may be attached to each side, as well.

The devices 31 and 33 preferably includes at least a mounting plane 37 including an electrically conducting material 39. The electrically conducting material 39 preferably is distributed over the surface of the devices 31 and 33 at locations adjacent where the plated through holes 5 are formed in the interposer. The devices may include plated through holes 41 and 45 including material 43 and 47 deposited on their surfaces. Preferably, the electrically conducting material 39 may be deposited around the plated through holes and electrically connected thereto. The devices may also include an electrically insulating plane 49 and 51 adjacent the mounting plane and joined thereto.

In the embodiment shown in FIG. 2, the devices 31 and 33 are joined using solder balls 35. Solder balls are well known to those skilled in the art and could be applied without any further description here. The device(s) 31 and 33 may also be joined to the interposer 100 with any other suitable technique, such as any surface mount process including other solder joints, BGA (Ball Grid Array or solder balls), conductive adhesive, conductive film, and thermal compression bonding, among others. Any other suitable technique may be used which forms bonds, in particular electrically conductive bonds between such devices 31 and 33 and the interposer 100. By including an interposer in an electronic package according to the invention, the device or component attached to the interposer may be easily attached and detached. Attachment and detachment allows changes in devices to be made, defective devices to be removed and any other changes made.

Each surface of the interposer may include a pattern of through holes formed in the same pattern as on the device(s) attached thereto so as to provide an exact match for the device. The interposer may also include a plurality of sets of through holes thereby allowing one interposer to accommodate many different devices. In such an embodiment, some through holes would be connected to a device and others would remain idle.

By providing a pattern of through holes on the interposer that matches the pattern on the device(s), an interposer according to the invention can be matched to a surface mounted device or component desired. This permits the interposer to be back-side attached in the same x-y location as components on the front side, without requiring any extra plated through holes in either the interposer or the device(s) and/or component(s) attached thereto. Of course, other embodiments of the interposer, as discussed above, may be included in an electronic package according to the present invention.

The present invention also includes a method of making an interposer including at least one passive electronic component within or on the interposer. Although other methods may be employed to make any interposer, the formation of the embodiment shown in FIG. 1 will be described herein. Of course, the method may be applied to make any other interposer structure without undue experimentation by one skilled in the art. Passive electric components or structures other than those disclosed herein may also be included in the interposer. The components included in the interposer, whether described herein or not, may be formed as described below or using any suitable process known to those skilled in the art.

Figure 3:
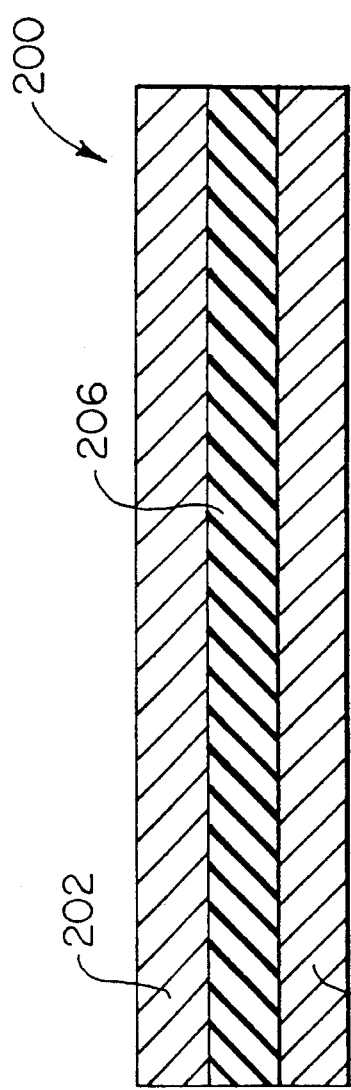
FIG. 3 represents a cross-sectional view of one embodiment of a core structure that may be employed to form an interposer structure, according to the present invention, including at least one passive electronic component

According to a method of the invention for forming an interposer, as shown in FIGS. 1 and 2, including a resistor, a core structure 200, shown in cross-section in FIG. 3, of the interposer may first be formed from two planes of an electrically conductive material 202 and 204 separated by a plane of an electrically insulating material 206. The electrically conducting planes 202 and 204, described here or below, may be formed from any suitable electrically conducting material, including those discussed above for forming the electrically conductive planes. Similarly, the plane of electrically insulating material 206, described here or below, may be formed from any suitable electrically insulating material, including those disclosed above.

In forming an interposer including at least one capacitor and/or conductor the above core structure 200 shown in FIG. 3 may be used. In such an embodiment, the electrically conductive planes 202 and 204 preferably will function as voltage planes. The electrically insulating plane 206 may be formed from a material with a high dielectric constant. At this point in the processing, other passive electronic components may be formed in the interposer using photolithography and etching techniques on the electrically conductive planes and/or by laminating additional planes and performing photolithography and etching techniques to the electrically conductive layers of the added planes. The resulting structure may then be processed by forming through holes and mounting planes, as described below.

In forming an interposer including at least one resistor, a plane including an electrically resistive material may be deposited between one of the electrically conductive planes and the electrically insulating plane. The electrically resistive material may include a material such as Ohmegaply, made by the Ohmega Corporation. Ohmegaply is a nickel-phosphorus material. Other electrically resistive materials may be used to form the resistor.

In an embodiment in which the interposer includes a resistor, a core preferably includes elements 9, 15, 17, and 21 in the embodiments shown in FIGS. 1 and 2. In forming the resistor, the electrically conductive plane 9 may be selectively etched and electrically insulating material 11 deposited. The resistor is then created since current must pass through the resistive plane on its path through the electrically conductive plane 21.

In further processing a core of an interposer including at least one resistor, a plane 25 of an electrically insulating material may then be formed by depositing a layer of an electrically insulating material on the surface of the electrically conductive plane 21 and on the passive electronic component plane 17. Electrically insulating materials which may be used to form the electrically insulating planes are discussed above. Any suitable method may be used to lay down the electrically insulating planes.

Next, a plane 7 of an electrically insulating material may then be formed over the electrically conductive plane 9. Any known method may be used to lay down the electrically insulating plane 7. Any of the substances discussed above may be used to form the electrically insulating plane. As shown in FIG. 1, the electrically conductive planes may not always be complete. Therefore, the planes of electrically insulating material may be laid down over exposed portions of the previously laid down electrically insulating plane. This situation is illustrated by the material 11 in FIG. 1. Such a condition may also exist elsewhere in the interposer making use of such a solution necessary in these locations as well.

At this point in the processing, other passive electronic components may be formed in the interposer by laminating and processing with techniques such as etching and photolithography other structures including more resistors, or other passive electronic components to the interposer structure including a resistor. The resulting structure may then be processed by forming mounting planes and through holes, as described below.

To form the mounting planes shown in the embodiment depicted in FIGS. 1 and 2, a plane 1 and 27 of an electrically conductive material may be formed by depositing a layer of an electrically conductive material over the two now exposed electrically insulating planes 7 and 25. Such electrically conducting planes may also be formed on other interposers according to the present invention, such as those including a capacitor as described above. An interposer including any other passive electronic component, such as a conductor or an inductor may also include mounting planes.

After being deposited, the electrically conductive planes 1 and 27 may then be etched to form a desired mounting plane, as in the embodiment shown in FIGS. 1 and 2, leaving material around through holes which may then be formed in the interposer. The mounting plane may also be formed using other processes, such as photopatterning, among others.

Through holes may be formed in the interposer prior to laying down the mounting plane. Alternatively, the through holes may be formed after laying down the mounting plane but prior to etching the mounting plane. The through holes may be formed by drilling or etching through the interposer structure. Regardless of when the through holes are formed, the mounting plane preferably extends over the surface of the electrically insulating plane adjacent each through hole.

As referred to above, through holes are formed through at least a portion of the interposer. The through holes may or may not extend completely through the interposer. In certain instances, it may be desirable to electrically connect a plated through hole on a device attached to the interposer to a plated through other than the one on another device attached to the same interposer through hole opposite on the opposite side of the interposer.

The plating material on the through holes preferably is selectively electrically connected to the electrically conductive plane(s) and/or the passive electronic component in the interposer structure.

Although the interposer described above includes a ground plane, a voltage plane, a resistor, a plurality of electrically insulating planes, a mounting plane on each side of the interposer and a plurality of plated through holes, the interposer may be formed with any combination of electrically conductive planes, electrically insulating layers, passive electronic components, mounting planes, through holes, and any other desired structure. Those skilled in the art, once aware of the present disclosure will be able to construct a desired structure without undue experimentation to provide an interposer functioning as desired.

The present invention also includes a method of forming an electronic package. In the method of forming an electronic package according to the present invention, an interposer including at least one passive electronic component may be provided. Alternatively, an embodiment of such interposer may be formed according to the above-described method.

At least one electronic component may then be attached to the interposer using solder balls, for example. Solder balls are well known to those skilled in the art and could be applied without any further description here. The device(s) may also be attached to the interposer by employing any other suitable technique, such as any surface mount process including other solder joints, BGA, conductive adhesive, conductive film, and thermal compression bonding, among others. Any other suitable technique may be used which forms bonds, in particular electrically conductive bonds between such devices and the interposer.

The devices or components may be attached to the interposer so that a signal travels from a signal site on a device attached to one side of the interposer into a plated through hole, through the passive electronic component in the interposer, through an electrically conductive plane electrically connected to the passive electronic component to the same or another plated through hole and to a device or component attached to the other side of the interposer. Of course any other flow path is possible for signals among attached devices and the interposer.

In this disclosure, there is shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. An interposer, comprising:
    a first face and a second face opposite said first face;
    at least one electrically conductive plane functioning as a power, ground, or signal plane;
    an electrically insulating plane positioned on opposite sides of said at least one electrically conductive plane;
    a plurality of plated through holes formed through the at least one electrically conductive plane and the at least one electrically insulating plane, said through holes being selectively joined to said at least one electrically conductive plane; and
    at least one passive electronic component positioned within the interposer.

2. An interposer according to claim 1, wherein said at least one passive electronic component is selected from the group consisting of an inductor a resistor, a capacitor, and a conductor.

3. An electronic package, comprising:
    an interposer, comprising:
        a first face and a second face opposite said first face;
        at least one electrically conductive plane functioning as a power, ground, or signal plane;
        an electrically insulating plane positioned on each side of said at least one electrically conductive plane;
        a plurality of plated through holes formed through the at least one electrically conductive plane and the electrically insulating planes, said through holes being selectively joined to said at least one electrically conductive plane; and
        at least one passive electronic component positioned within the interposer;
    at least one first component mounted to said first face of said interposer, said at least one first component including a plurality of ground, power, and signal sites electrically connected to said plated through holes of said interposer; and
    at least one second component mounted to said second face of said interposer, said at least one second component including a plurality of ground, power, and signal sites electrically connected to said plated through holes of said interposer;
    wherein said interposer provides selective connections between said ground, power, and signal sites of said at least one first component and said at least one second component.

4. An electronic package according to claim 3, wherein said at least one first component and said at least one second component are selected from the group consisting of a chip carrier, an interposer, a circuit board, a circuit card, and a chip.

5. An electronic package according to claim 3, wherein said at least one first component and said at least one second component are any surface mountable components.

6. An electronic package according to claim 3, wherein said at least one first component and said at least one second component are attached to said interposer with a surface mount process.

7. An electronic package according to claim 3, wherein said at least one first component and said at least one second component are mounted on said interposer with a surface mount process selected from the group consisting of solder joints, BGA, conductive adhesive, conductive film, thermal compression bonding.

8. An electronic package according to claim 3, wherein said at least one passive electronic component is selected from the group consisting of an inductor a resistor, a capacitor, and a conductor.

9. An interposer, comprising:
    alternating electrically conducting and insulating planes;
    a plurality of plated through holes formed through the electrically conductive and electrically insulating planes; and
    a plane including at least one passive electronic component selected from the group consisting of a resistor, a capacitor, and an inductor.

* * * * *